United States Patent
Huang

(10) Patent No.: US 6,674,152 B2
(45) Date of Patent: Jan. 6, 2004

(54) BIPOLAR DIODE

(75) Inventor: Eddie Huang, Stockport (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/062,601

(22) Filed: Jan. 31, 2002

(65) Prior Publication Data

US 2002/0121678 A1 Sep. 5, 2002

(30) Foreign Application Priority Data

Mar. 2, 2001 (GB) ............................................. 0102734

(51) Int. Cl.[7] ..................... H01L 31/075; H01L 31/105; H01L 31/117; H01L 29/167; H01L 29/207
(52) U.S. Cl. ..................... 257/656; 257/655; 257/657; 257/665
(58) Field of Search ................. 257/656, 655, 257/657

(56) References Cited

U.S. PATENT DOCUMENTS

| | | | |
|---|---|---|---|
| 4,646,115 A | 2/1987 | Shannon et al. ............. 357/15 |
| 4,941,026 A | 7/1990 | Temple ....................... 357/23.4 |
| 5,272,370 A | * 12/1993 | French ........................ 257/353 |
| 5,886,374 A | * 3/1999 | Sakamoto et al. ........... 257/292 |
| 6,069,371 A | 5/2000 | Omura et al. ................ 257/133 |
| 6,252,288 B1 | * 6/2001 | Chang ......................... 257/471 |

FOREIGN PATENT DOCUMENTS

WO    WO9953553    4/1999    ......... H01L/29/861

OTHER PUBLICATIONS

B.Jayant Baliga, "Power Semiconductor Devices", North Carolina State University, pp 153–182, US 4,646,115 (PHB 33047).

* cited by examiner

Primary Examiner—Eddie Lee
Assistant Examiner—Jesse A. Fenty
(74) Attorney, Agent, or Firm—Steven R. Biren

(57) ABSTRACT

A bipolar p-i-n diode has a first (1) and second (5) region of opposite conductivity type and an intermediate drift region (3) between the first and second regions. Trenched field relief regions (14) are arranged to deplete the intermediate drift region (3) when the diode is reverse biased, so permitting a higher doping (12) to be used for the intermediate drift region (3) for a given breakdown voltage. This improves both the turn-on and turn-off characteristics of the diode.

5 Claims, 2 Drawing Sheets

BIPOLAR DIODE

FIELD OF THE INVENTION

The invention relates to a P-N Diode suitable for use as a rectifier and a method of making it. In particular, the invention provides a fast bipolar P-N diode of the type having an intermediate drift region, i.e. of the P-i-N type.

BACKGROUND

P-i-N rectifiers are well known for power circuit applications. An intermediate drift region (i-region) is sandwiched between highly doped p and n regions of a junction diode. The intermediate drift region has a lower doping than the p or the n regions. During forward conduction, the i-region is flooded with minority carriers therefore allowing the resistance of the region to become very small to allow the diode to carry a high current density during forward conduction. A useful discussion of such devices is contained in the textbook "Power Semiconductor devices" by B. Jayant Baliga published by the PWS Publishing Company, Boston in 1995, particularly section 4.2, pages 153 to 182.

With suitable choices of parameters, especially the thickness and dopant concentration of the i-region, it has proved possible to develop such rectifiers with very high breakdown voltages Significant drawbacks of the P-i-N rectifier relate to the need to inject a high concentration of minority carriers into the i-region for conduction. This gives rise to two problems. Firstly, as the diode is turned on the diode has a very high resistance until the minority carriers are injected into the i-region. Accordingly, during turn-on there is a high current flow across a resistive region which gives rise to a large voltage drop across the diode.

Secondly, during turn-off the minority carrier charge stored in the i-region must be removed. This requires a significant time, a large reverse current together with a negative voltage overshoot. As the switching speed of a diode or rectifier increases, these effects become worse. In particular, it would be beneficial to reduce the reverse recovery time.

It has been found that a faster reverse recovery can be obtained when the carrier lifetime in the i-region is reduced. Accordingly, a popular approach to speeding reverse recovery is to include gold or platinum recombination centres in the i-region. This is known as gold or platinum "killing" and has been found to significantly improve reverse recovery times.

Unfortunately, gold or platinum killed diodes suffer from a high temperature dependence of their switching behaviour, since minority carrier lifetime increases rapidly with temperature when controlled by deep recombination centres such as gold and platinum. Furthermore, the carrier distribution in a heavily gold or platinum doped i-region is uneven across the thickness of the i-region. This is because the short carrier lifetime means that recombination reduces the carrier density in the middle of the i-region. This U-shaped carrier distribution leads to a non-soft recovery and to ringing, because the higher carrier density at the edges of the i-region takes longer to fall to zero than the central region which accordingly becomes suddenly depleted during the application of blocking voltage giving a rapid decay of current leading to snap-off and ringing.

Accordingly, there is a need to improve the performance of the P-i-N diode structures for rapid-switching high-power applications.

SUMMARY

According to the invention there is provided a semiconductor diode, comprising a first doped region of a first conductivity type; an intermediate drift region of the first conductivity type doped with a dopant concentration less than that in the first region; a second doped region of a conductivity type opposite to the first conductivity type, sandwiching the intermediate drift region between the first and second regions, wherein the second doped region forms a bipolar diode structure with the intermediate and first regions; and a plurality of field electrodes for depleting the intermediate drift region under reverse bias, the plurality of field electrodes being arranged in a plurality of closely spaced insulated trenches extending laterally across the semiconductor diode and extending through the second and intermediate regions.

As is explained in more detail below, the use of this structure permits a significantly improved recovery time.

For a given dopant concentration for the intermediate drift region, the use of the field electrodes increases the breakdown voltage that would otherwise be obtained under reverse bias, since in this situation the depletion layer around the trenches and between the opposite conductivity type regions of the bipolar diode extends so far as to deplete the whole intermediate region. Under forward bias, the depletion layer retreats to allow conduction through the diode structure.

However, more importantly, the use of the structure according to the invention allows a higher than normal doping of the intermediate drift region for a given required blocking voltage. The doping may be of the same order of magnitude as the minority carrier density injected into the drift intermediate drift region. Accordingly, the intermediate drift region may have a dopant concentration from $10^{15}$ cm$^{-3}$ to $10^{17}$ cm$^{-3}$.

The use of higher doping in the intermediate drift region reduces charge storage in the drift region during forward conduction since much of the charge required to carry current is obtained from dopant atoms in that region rather than being injected by minority carriers. Thus, the level of injected charge needed for a given current is reduced. This greatly increases the speed of reverse recovery without needing lifetime killer centres such as gold and platinum doping. Accordingly, the disadvantages of non-soft recovery and high temperature dependence of switching characteristics that would be associated with such doping can be reduced or eliminated.

Furthermore, the use of a higher doping gives rise to a lower transient voltage drop during turn-on. During turn-on, there is normally a larger voltage drop across a conventional p-i-n diode than in the steady-state, because the injected charge distribution has not yet been fully established in the intermediate region. The higher doping level allowed by the invention can lower the pre-modulation resistance and reduce the voltage overshoot. This effect is additional to the reduced reverse recovery time. Thus, the invention can produce advantageous results both during turn-on and turn-off.

The size of the improvement in recovery time will vary with a number of factors, such as the distance between trenches.

The more closely spaced the trenches, the greater the improvement will be, but as a trade-off the more silicon real estate will be used for the trenches.

Accordingly, the skilled person will select the distance between the trenches to be sufficiently closely spaced to give a benefit in recovery time without sacrificing too much area. Generally, the trenches will be at a spacing of less than 10 μm.

There may be no lifetime killers in the intermediate drift region. Alternatively, there may be a reduced density of lifetime killers compared with prior art diodes. In this way, the temperature dependence of diode properties may be reduced.

A similar structure of field regions is used in Schottky diode structures, such as described for example in U.S. Pat. No. 4,646,115, (our ref. PHB33047). In the structure described in that document field relief regions are provided to improve the breakdown voltage of the main junction to a value higher than would be possible without the field relief regions. This in turn allows the use of a higher doped (and possibly thinner) epilayer than would normally be allowed for a particular Schottky breakdown voltage. This is of special benefit in unipolar devices since the doping and thickness of the epi-layer has a large influence on the on-state voltage drop which may accordingly be reduced. As the skilled person will appreciate, the ability to use a higher doping level than normally allowed for a given blocking voltage has very little influence on the on-state voltage drop of a bipolar, p-n diode. Accordingly, little or none of the benefit of the field regions that would be obtained in a Schottky device is obtained in bipolar devices and accordingly field relief regions have not, as far as the inventor is aware, been used on bipolar diode structures.

In a p-n diode in accordance with the present invention, the second doped region and intermediate drift region may be formed as epitaxial layers (also termed epilayers) deposited on a substrate. The first doped region may likewise be an epilayer or may alternatively be constituted by the doped substrate. The trenches preferably extend into the first doped region.

The field electrode of the trench may be of polycrystalline silicon (also termed polysilicon) doped to the same conductivity type as the second doped region.

The first doped region may be a highly doped n+layer, the intermediate drift region may be an n layer and the second doped region may be a p layer.

The field electrode may be of any suitable conductor, such as doped polysilicon.

The insulated trenches and field electrodes may form a grid extending across the semiconductor device.

A top metallisation may be provided extending across the semiconductor diode to contact the field electrodes and the second doped region. A rear contact metallisation may be arranged on the opposite face of the semiconductor diode to the top metallisation to provide an electrical connection to the first doped region.

In embodiments, the first doped region and intermediate drift region may be formed of a first semiconductor material and the second doped region may be a thin region formed of a second semiconductor material having a lower band-gap than the first semiconductor material. The lattice mismatch of the first and second semiconductor materials and the thickness of the thin second region may be selected such that the level of mechanical stress remains below a level at which misfit dislocations are formed. By using such a structure, the doping required in the intermediate drift region may be higher than otherwise for a given blocking voltage, which in turn may improve the properties of the diode as explained above.

Preferably, the product of the thickness of the thin second region and the relative deviation of the lattice constants of the first and second semiconductor materials does not exceed 30 nm %, to avoid excessive misfit dislocations.

BRIEF DESCRIPTION OF THE DRAWINGS

Specific embodiments of the invention will now be described, purely by way of example, with reference to the accompanying drawings, in which.

Figure 1A:
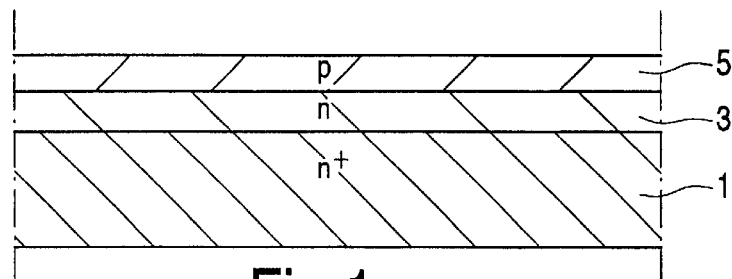
FIG. 1 illustrates process steps in the manufacture of a diode according to the invention.

A p-n semiconductor rectifier diode according to a specific embodiment of the invention is formed on an n+monocrystalline silicon substrate 1. On top of this substrate, an n-type silicon epilayer 3 doped from $1 \times 10^{15}$ to $1 \times 10^{17}$ cm$^{-3}$ and between 5 μm and 40 μm thick is grown. On top of the n-epilayer 3, a p-type silicon epilayer 5 is grown. The structure shown in FIG. 1a results at this stage.

Figure 2:
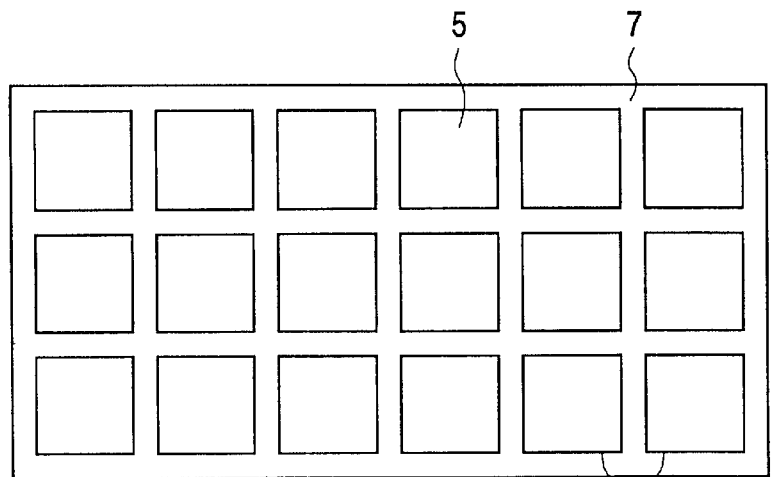
FIG. 2 is a top view of the embodiment of FIG. 1.

A plurality of closely spaced trenches 7 less than 10 μm apart are then etched through the p- and n-epilayers 3, 5 and preferably into the substrate. These are formed by patterning photo-resist and then dry-etching the trenches in a known way. FIG. 2 shows a top view of the arrangement of the trenches 7. As can be seen, the trenches 7 divide the semiconductor substrate 1 and epilayers 3, 5 into a plurality of mesas 6.

The trenches 7 are arranged to be sufficiently close together, generally less than 10 μm apart, that when the finished diode is reverse biased the whole of the intermediate region 3 is depleted.

Figure 1B:
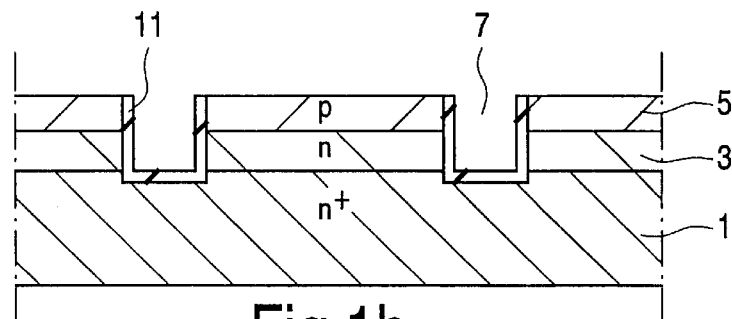

Next, an insulating oxide layer 11 is grown on the inside of the trenches 7. The resulting structure is shown in FIG. 1b.

Figure 1C:
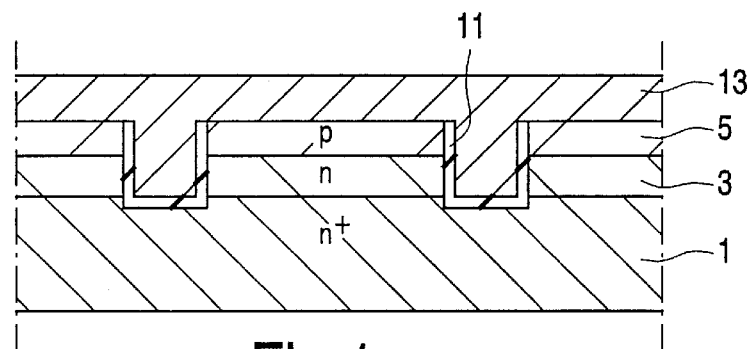
Figure 1D:
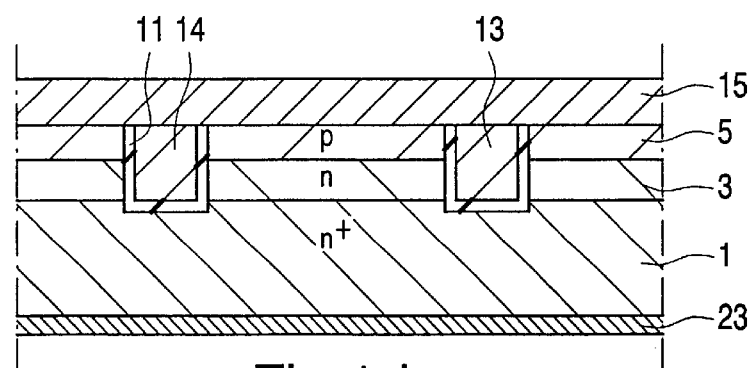

Polysilicon 13 is then deposited to fill the trench 7 using low pressure chemical vapour deposition (LPCVD). The polysilicon may be deposited already doped, or it may be doped subsequent to its deposit. The resulting structure is shown in FIG. 1c.

A dry etch is then used to planarise the polysilicon 13 and etch it back to the top of the trench. The remaining polysilicon 13 forms a plurality of field electrodes 14. A metal layer 15 acting as a contact is then deposited over the top of the polysilicon 13 and the top of the p-type epilayer 5. Contact metallisation 23 is likewise applied to the rear of the substrate 1.

Figure 3:
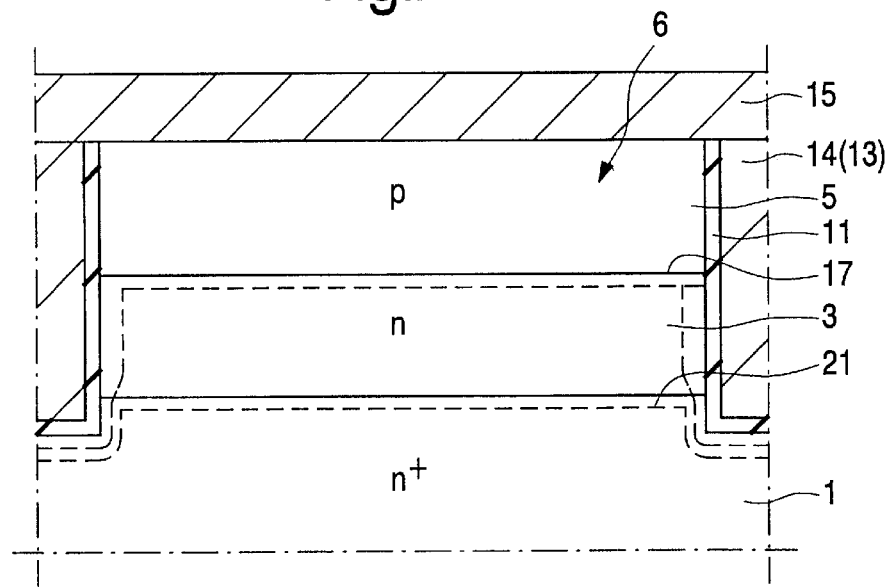
FIG. 3 is a sectional view of part of the device of FIG. 1 in use.

The operation of the diode as a rectifier will now be described with reference to FIG. 3. The regions 1, 3 and 5 are not hatched in FIG. 3, for clarity in the drawing.

When the diode is forward biased, carriers are injected into the intermediate region 3 from the regions 5 and 1, and the carrier density increases over the dopant concentration 12. The higher doping 12 of the intermediate region 3 compared with conventional P-i-N diodes means that during conduction the carriers in the intermediate region 3 are obtained both from ionisation of the dopant atoms and by injection, in proportions that may vary but would typically be of the same order of magnitude. For example, the injected charge density may be $10^{17}$ cm$^{-3}$. It is noted that the doping of the intermediate (drift) region 3 is within a factor of 3 of the minority carrier density injected into the drift intermediate drift region during normal use.

When the diode is reverse biased the depletion region extends from the p-n junction 17 and from the trenches 7 throughout the intermediate region 3 to a boundary 21 in the highly doped substrate 1. This occurs because the trenches 7 are spaced sufficiently close together. The depletion region spreading from the trenches 7 due to the presence of the field relief electrodes 14 means that a higher doping 12 for the intermediate region 3 can be used than would otherwise be possible for a given blocking voltage. This higher doping 12 then reduces the level of minority carrier injection required for a given current density, which in turn reduces the recovery time during turn-off. This method of reducing recovery time is superior to conventional gold or platinum killing.

Thus, by having this higher doping 12 for the intermediate drift region 3, charge storage in the drift region 3 during forward conduction is reduced, because much of the charge required to carry current is now obtained from dopant atoms in the region 3 (rather than being injection by minority carriers from the region 5). Thus, the level of injected charge needed for a given current is reduced. As a result, the speed of reverse recovery is greatly increased without needing lifetime killer centres such as gold and platinum doping. Accordingly, the disadvantages of non-soft recovery and high temperature dependence of switching characteristics that would be associated with gold or platinum doping can be avoided.

Furthermore, the use of the higher doping 12 for the region 3 gives rise to a lower transient voltage drop during turn-on. During turn-on, there is normally a larger voltage drop across a conventional p-i-n diode than in the steady-state. This is because the injected charge distribution has not yet been fully established in the intermediate region. The higher doping level 12 allowed by the invention for the region 3 inherently supplies more charge carriers in the region 3, and so can lower the pre-modulation resistance and reduce the voltage overshoot. this effect is additional to the reduced reverse recovery time.

Thus, the invention can produce advantageous results both during turn-on and turn-off.

The invention is capable of application to rectifiers handling a wide range of voltages, for example 100V to 600V. The diode described is particularly useful for rectifiers for handling voltages around 200V to 300V.

Figure 4:
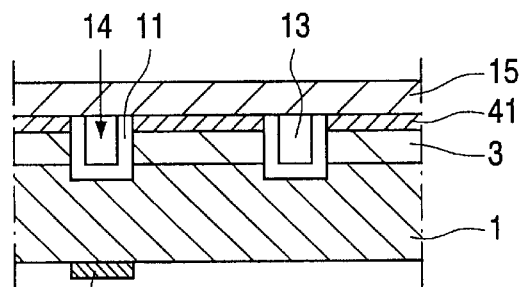
FIG. 4 is a sectional view of a second embodiment of a diode according to the invention.

Referring to FIG. 4, in an alternative embodiment of the invention the p-type silicon epilayer 5 of the first embodiment is replaced by a thin layer of a different semiconductor material 41 with a lower bandgap. In the specific example a thin (20 nm thick) silicon-germanium layer 41 with about 20% germanium by mass is used, although in alternative embodiments different amounts of germanium in the range 0 to 20% may be used. The thickness of the thin silicon-germanium layer is selected such that the thickness in combination with the deviation of the lattice constants of the thin silicon-germanium layer and silicon intermediate layer 3 and substrate 1 does not create misfit dislocations. In SiGe, this can be done by ensuring that the product of the thickness of the thin SiGe layer 41 and deviation of the lattice constant of the second SiGe semiconductor material from the lattice constant of Si does not exceed 30 nm %.

In a diode according to FIG. 1, much of the current through the diode when the diode is turned on is the hole current of holes from the p-type silicon epilayer 5 injected into the n-type silicon epilayer 3. The contribution of the electron current injected from the intermediate epilayer 3 into the p-type epilayer 5 is generally significantly smaller, since the doping in the intermediate epilayer 3 is generally smaller than the doping in the p-type epilayer 5. The injected holes remain for some time in the intermediate layer 3, but need to be removed when the device is turned off. The removal of these holes takes a significant time.

In the arrangement of FIG. 4, the use of a thin layer 41 of different semiconductor material alters the ratio of hole and electron currents. Compared to the structure in FIG. 1, a larger fraction of the current through will be carried by electron current injected from n-type intermediate layer 3 into the p-type SiGe layer. The number of holes injected from the p-type SiGe layer into the intermediate layer will therefore be lower, for the same on-state current. The reduced number of holes injected into the intermediate layer reduces the number of holes present in that layer and hence also reduces the time taken to turn the device off.

The structure of FIG. 4 is particularly suitable for diodes having a higher blocking voltage than those of FIG. 1, for example about 600V rather than 200–300V. However, the use of a thin silicon-germanium layer is not restricted to diodes of any particular blocking voltage, but may be used in diodes of any voltage as required.

The use of a thin silicon germanium layer has been previously described in WO99/53553 (our ref: PHN16848) in the context of conventional bipolar diodes without field relief structures. However, in order to reach blocking voltages of 600V WO99/53553 suggests that recombination centres, also known as lifetime killers, may need to be added to the intermediate layer to reduce the hole concentration in the intermediate layer during forward operation. This creates difficulties in manufacture and also ringing and other undesirable properties during diode turn-off. The approach according to the present invention allows a reasonable blocking voltage, for example 600V, to be achieved without the use of lifetime killers, or with a lower concentration of lifetime killers than would otherwise be required.

The skilled person will appreciate that the invention is not restricted to the described embodiments. In particular, although the embodiment described uses an n-type intermediate layer 3 on an n+type substrate 1, it is also possible to use the invention with either p or n type intermediate layers 3 on either p or n type substrates 1. Semiconductor materials other than silicon may be used for the substrate 1 and layers 2 and 3, for example silicon carbide. Different dopings may then be used.

Moreover, although the material 13 that fills the trench 7 in the specific embodiment is doped polysilicon, the skilled person will realise that any other suitable conductor may be used.

The oxide layer 11 may be deposited rather than grown or even replaced by other suitable insulating layers such as a nitride layer or an oxide-nitride layer.

The first doped layer 1 may be an epilayer formed on a semiconductor substrate.

The top metallisation 15 may be any suitable conductive material, such as aluminium, doped polysilicon or other metal or semiconductor.

What is claimed is:

1. A semiconductor diode, comprising
    a first doped region of a first conductivity type;
    an intermediate drift region of the first conductivity type doped with a dopant concentration less than that in the first region;
    a second doped region of a conductivity type opposite to the first conductivity type, sandwiching the intermediate drift region between the first and second regions, wherein the second doped region forms a bipolar diode structure with the intermediate and first regions; and a plurality of field electrodes for depleting the intermediate drift region under reverse bias, the plurality of field electrodes being arranged in a plurality of closely spaced insulated trenches extending laterally across the semiconductor diode and extending through the second and intermediate regions, wherein the first doped region and intermediate drift region are formed of a first semiconductor material and the second doped region is a thin region formed of a second semiconductor material having a lower band-gap than the first semiconductor material, the thickness of the thin second region and the lattice mismatch of the first and second semiconductor materials being selected such that the level of mechanical stress remains below a level at which misfit dislocations are formed.

2. A semiconductor diode according to claim 1, wherein the product of the thickness of the thin second region and the relative deviation of the lattice constants of the first and second semiconductor materials does not exceed 30 nm %.

3. A semiconductor diode according to claim 2 wherein the field electrodes form a grid extending across the semiconductor device.

4. A semiconductor diode according to claim 2 further comprising a metallisation extending across the semiconductor device to contact the field electrodes and the second doped region; and a rear contact on the opposite face of the semiconductor device to provide an electrical connection to the first doped region.

5. A semiconductor diode according to claim 2, wherein the intermediate drift region and the second doped region are epitaxial layers.

* * * * *